US005561511A

United States Patent [19]

Mizunuma et al.

[11] Patent Number: 5,561,511

[45] Date of Patent: Oct. 1, 1996

[54] RELEASING ELASTIC ROLLER AND FIXING DEVICE UTLIZING THE SAME

[75] Inventors: Noboru Mizunuma; Haruo Naruse, both of Yokohama; Ikuyo Kawakami, Kawasaki, all of Japan

[73] Assignee: Canon Kabushiki Kaisha, Tokyo, Japan

[21] Appl. No.: 272,613

[22] Filed: Jul. 11, 1994

Related U.S. Application Data

[63] Continuation of Ser. No. 971,678, Nov. 4, 1992, abandoned, which is a continuation of Ser. No. 597,336, Oct. 15, 1990, abandoned.

[30] Foreign Application Priority Data

Oct. 16, 1989 [JP] Japan .................................... 1-269574
Sep. 10, 1990 [JP] Japan .................................... 2-240490
Sep. 10, 1990 [JP] Japan .................................... 2-240491

[51] Int. Cl.[6] ........................................ G03G 15/20

[52] U.S. Cl. .......................... 355/282; 219/469; 355/290; 355/295; 492/53

[58] Field of Search .................................... 355/282, 285, 355/289, 290, 295; 219/216, 469; 492/28, 46, 53, 56, 16

[56] References Cited

U.S. PATENT DOCUMENTS

| | | | |
|---|---|---|---|
| 4,078,286 | 3/1978 | Takiguchi et al. | 492/56 |
| 4,196,256 | 4/1980 | Eddy et al. | 428/422 |
| 4,596,920 | 6/1986 | Inagaki | 355/290 X |
| 4,724,305 | 2/1988 | Iimura et al. | 219/469 |
| 4,810,564 | 3/1989 | Takahashi et al. | 428/213 |
| 4,883,715 | 11/1989 | Kuge et al. | 219/216 X |
| 4,949,130 | 8/1990 | Torino | 355/282 |
| 5,011,401 | 4/1991 | Sakurai et al. | 432/60 |
| 5,034,777 | 7/1991 | Ohzeki et al. | 355/274 |
| 5,035,950 | 7/1991 | Del Rosario | 428/421 |
| 5,073,434 | 12/1991 | Frank et al. | 428/195 |
| 5,178,071 | 1/1993 | Hyllberg | 101/489 |
| 5,253,024 | 10/1993 | Okuda et al. | 355/282 X |
| 5,270,777 | 12/1993 | Yoshida et al. | 355/290 |
| 5,319,427 | 6/1994 | Sakurai et al. | 355/285 |

FOREIGN PATENT DOCUMENTS

| | | | |
|---|---|---|---|
| 295901 | 12/1988 | European Pat. Off. . | |
| 443799 | 8/1991 | European Pat. Off. . | |
| 0111178 | 6/1984 | Japan | 355/290 |
| 60-100164 | 6/1985 | Japan . | |
| 0184575 | 8/1986 | Japan | 355/290 |
| 61-251881 | 11/1986 | Japan . | |
| 63-218982 | 9/1988 | Japan . | |
| 1127677 | 5/1990 | Japan . | |

OTHER PUBLICATIONS

Research Disclosure, S. I. Wenthe et al., No. 155, Mar., 1977, 'Sheet Handling Apparatus'.

*Primary Examiner*—Thu Anh Dang
*Attorney, Agent, or Firm*—Fitzpatrick, Cella, Harper & Scinto

[57] ABSTRACT

The present invention provides a mold releasing elastic roller having an insulating elastic layer; an insulating and mold releasing surfacial layer formed on said elastic layer; and a primer layer for adhering the elastic layer and the mold releasing surfacial layer, the primer layer containing a material of low resistance.

19 Claims, 4 Drawing Sheets

RELEASING ELASTIC ROLLER AND FIXING DEVICE UTLIZING THE SAME

This application is a continuation of application Ser. No. 07/971,678, filed Nov. 4, 1992, now abandoned, which was a continuation of application Ser. No. 07/597,336, filed on Oct. 15, 1990, now abandoned.

BACKGROUND OF THE INVENTION

1. Field of the Invention

The present invention relates to a roller excellent in elasticity and in mold releasing ability, and more particularly to a fixing roller for fixing a toner image by applying at least pressure thereto and a fixing device utilizing such roller.

2. Related Background Art

Although various image fixing devices have been proposed and practiced, there is principally employed, at present, so-called heat roller fixing device consisting of paired rollers having a heat source in at least one of said rollers, as shown in FIG. 3, in consideration of the thermal efficiency. In such fixing device, a heating roller 1 having a heat source (halogen lamp in this case) 3 and coming into contact with the unfixed toner and a pressure roller 2 usually having an elastic layer are maintained in pressure contact with a suitable nip width, and are rotated by drive means (not shown) in directions indicated by arrows. The surface temperature of the heating roller 1 is detected by a thermistor 4 and is maintained at an appropriate value. Upon passing of a recording sheet bearing an unfixed toner image thereon between said paired rollers, the thermofusible toner on said sheet is fixed by heat and pressure. The thermal conduction in such device is significantly better than in other fixing methods, because of direct contact of the toner with the fixing roller equipped with heat source therein.

However, such heat roller fixing method is associated with an offset phenomenon, which is the transfer of toner onto the roller. Said offset phenomenon is caused by a lack of temperature control, including low-temperature offsetting resulting from lowering of the surface temperature of the heating roller and high-temperature offsetting resulting from elevation of said surface temperature, and from an electrostatic factor, resulting from attraction or repulsion between the surface potential of the: roller and the charge of the toner.

Said temperature factor can be eliminated by precise control of the surface temperature of the heating roller, but the electrostatic factor is difficult to eliminate.

In order to reduce the surface potential of the heating roller, it has been proposed to compose the surface layer of the heating roller with a material of low resistance and to ground said surface layer.

The surface of the pressure roller is also required to have excellent releasing ability for the toner and to be flexible under pressure to form a satisfactory nip, Said pressure roller, maintained in pressure contact with said heating roller, may also be charged up by frictional charging, and may lead to electrostatic offsetting of the toner.

However, if a material of low resistance is contained in the surface layer of the pressure roller in order to preventing the charging thereof, the releasing ability of the surface is deteriorated, so that the surface of the pressure roller is smeared by toner adhesion thereon after fixing of many sheets. In an even worse case, the toner on the roller surface is again offset onto the rear surface of the copy sheet, thus smearing said rear surface.

Such phenomenon is particularly evident in a two side or both-face image forming apparatus in which the pressure roller comes into contact with the toner after in fixing, and a device lacking the cleaning mechanism for the pressure roller.

For this reason there is employed a charge eliminating brush, but such brush cannot provide enough effect for preventing the charge generation at the nip of the rollers, and loses the charge eliminating ability when the brush is smeared with toner or paper dust.

SUMMARY OF THE INVENTION

An object of the present invention is to provide an elastic roller with limited elevation of the surface potential.

Another object of the present invention is to provide an elastic roller free from deterioration of the mold releasing ability of the surface and capable of suppressing the charging of the roller surface.

Still another object of the present invention is to provide an elastic roller in which a primer layer for adhering a releasing layer to an elastic layer is made low electric resistance.

Still another object of the present invention is to provide a heat roller fixing device capable of electrostatic offsetting of toner.

Still other objects of the present invention will become fully apparent from the following description.

DESCRIPTION OF THE PREFERRED EMBODIMENTS

Now the present invention will be clarified in detail by embodiments shown in the attached drawings, wherein components of equivalent functions are represented by a same number.

Figure 1:
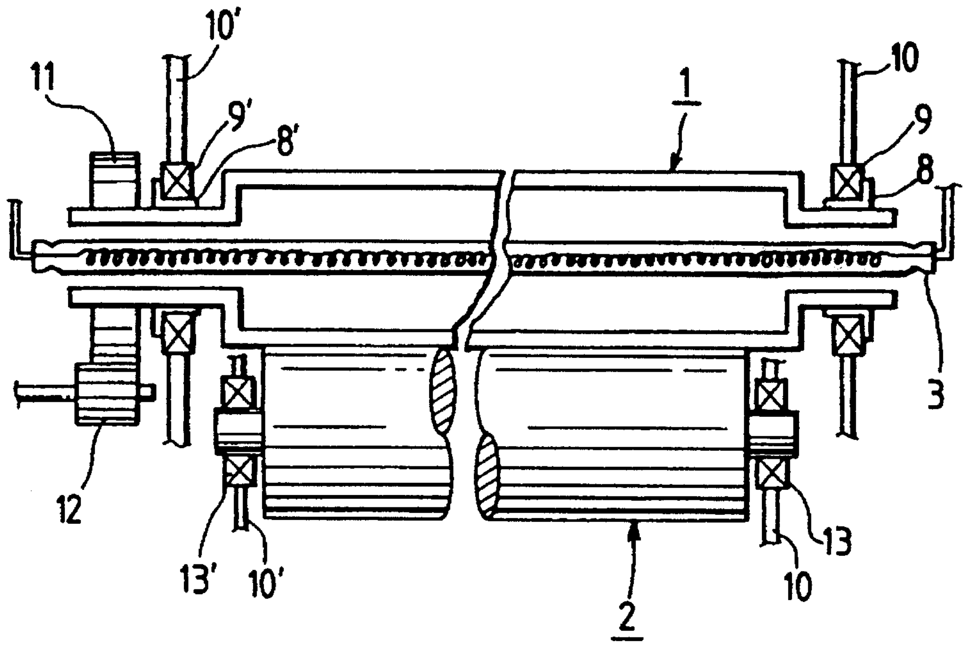
FIG. 1 is a schematic cross-sectional view of a fixing device embodying the present invention.

FIG. 1 is a cross-sectional view of an embodiment of the fixing device of the present invention, wherein a heating roller 1 is composed of a conductive core (stainless steel, aluminum etc.) and a tetrafluoroethylene resin layer formed thereon and containing a material of low resistance such as carbon black. The heating roller 1 is provided therein with a halogen heater 3, and is rotatably supported, by means of heat-resistant conductive resinous members 8, 8' and ball bearings 9, 9', on side plates 10, 10', of the fixing device. Said roller is extended, at the far side (left side in FIG. 1), beyond the side plate, and the metal core is fitted with a gear 11 of heat-resistant insulating resin. Said gear 11 meshes with a driving gear 12 of drive means (not shown) and serves to rotate the roller 1.

On the other hand, a pressure roller 2 is also rotatably supported on the side plates 10, 10', by means of slidable bearings 13, 13'. It is pressed to the heating roller 1 with an appropriate pressure exerted by pressurizing means (now shown), and is rotated by said heating roller 1.

Figure 2:
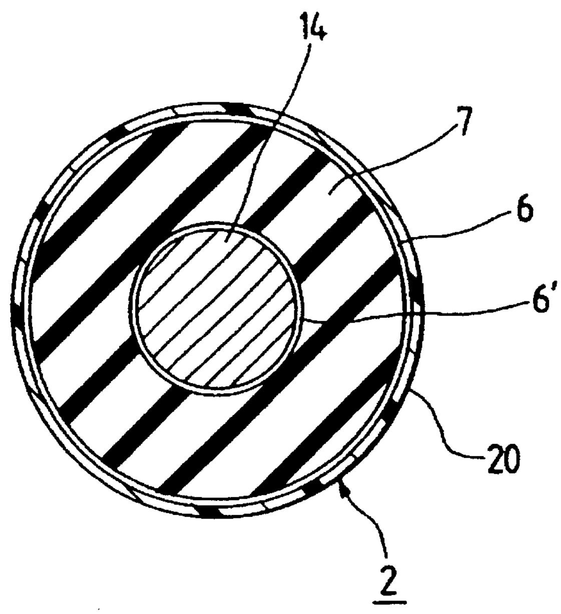
FIG. 2 is a cross-sectional view of a pressure roller employed in the embodiment shown in FIG. 1.

FIG. 2 is a cross-sectional view of the pressure roller of the embodiment shown in FIG. 1.

A filler-free pure fluorinated resin (for example perfluoroalkoxy (PFA) resin) layer 20 is adhered, by a primer layer 6, onto an insulating rubber layer 7, which is preferably composed of silicone rubber but may be composed also of fluorinated rubber or a mixture of fluorinated rubber and silicone rubber.

The electrically floating primer layer 6 is composed of rubber or resinous adhesive material in which a material of low resistance (for example carbon fibers, graphite whiskers, silicon carbide fibers, silicon carbide whiskers, a metal oxide such as titanium oxide, or nickel) is mixed to reduce the volume resistivity to $10^1$ Ω·cm or lower. For adhering the rubber layer 7 to the metal core 14 there is also employed primer 6', which may be same as the above-mentioned primer 6 but is preferably free from the low-resistance material.

Figure 3:
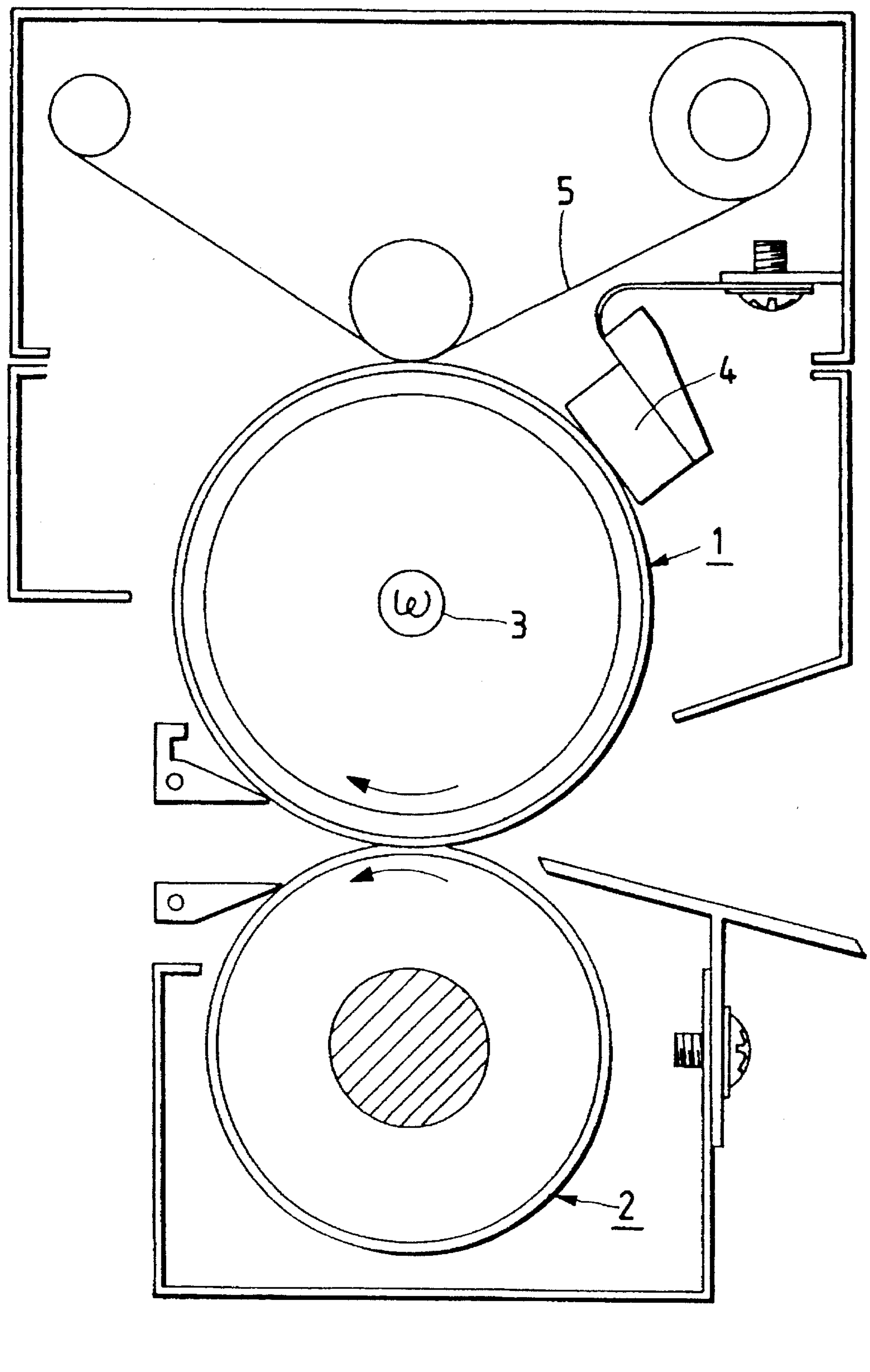
FIG. 3 is a cross-sectional view of a conventional fixing device.

Although not shown in FIG. 1, a thermistor 4 for detecting the surface temperature and a cleaning web 5 are maintained in contact with the heating roller as shown in FIG. 3.

In the following there will be explained the effect of the embodiment shown in FIG. 1, in comparison with a reference example in which the primer layer 6 is made insulating.

Table 1 compares the embodiment of the present invention with the case utilizing a conventional pressure roller, by the amount of toner off-setting in consecutive fixing of 60 copies obtained from a lined business form original.

In this comparison the fixing operation is conducted on unfixed toner image, formed by developing a negatively chargeable organic photoconductive member with positively charged toner and transferred onto a recording sheet.

TABLE 1

| | Structure of pressure roller | Consecutive 60 sheets |
|---|---|---|
| Conventional structure | insulating primer | Smear was generated on copy sheet by toner offsetting after passing of several sheets |
| Present embodiment | low-resistance primer | No problem after consecutive passing of 60 sheets |

Table 2 shows the surface charge state of the pressure roller employed in the experiment shown in Table 1.

TABLE 2

| | Structure of pressure roller | upon sheet passing | upon sheet non-passing |
|---|---|---|---|
| Conventional structure | insulating primer | +1500 V~ +2000 V | +1500 V~ +2000 V |
| Present embodiment | low-resistance primer | +200 V~ +400 V | +200 V~ +400 V |

As shown in Table 2, while the roller utilizing insulating primer is positively charged to several thousand volts, the roller of the present embodiment is charged only to +400V at maximum, or about +200V at minimum.

These results indicate that a pressure roller, which has a tendency of being positively charged, can be excessively charged positively. On the other hand, the transfer sheet and toner in friction contact with the roller are also charged in same (positive) polarity. It is therefore estimated that the toner is pressed to the heating roller due to the strong electrostatic repulsion from the pressure roller, is separated from the transfer sheet even if completely fused and is offset to the heating roller. This tendency becomes naturally stronger in positively charged toner.

However the pressure roller of the present embodiment, containing an electrically floating low-resistance material in the primer 6 and characterized by the low surface potential, is almost free from the electrostatic repulsion for pushing the toner toward the heating roller 1, thereby reducing the offsetting of toner.

The reduction of the surface potential of the pressure roller by the presence of an electrically floating condition low-resistance primer layer between the insulating rubber layer and the surface releasing layer can be analyzed in the following manner.

Figures 4A, 4B:
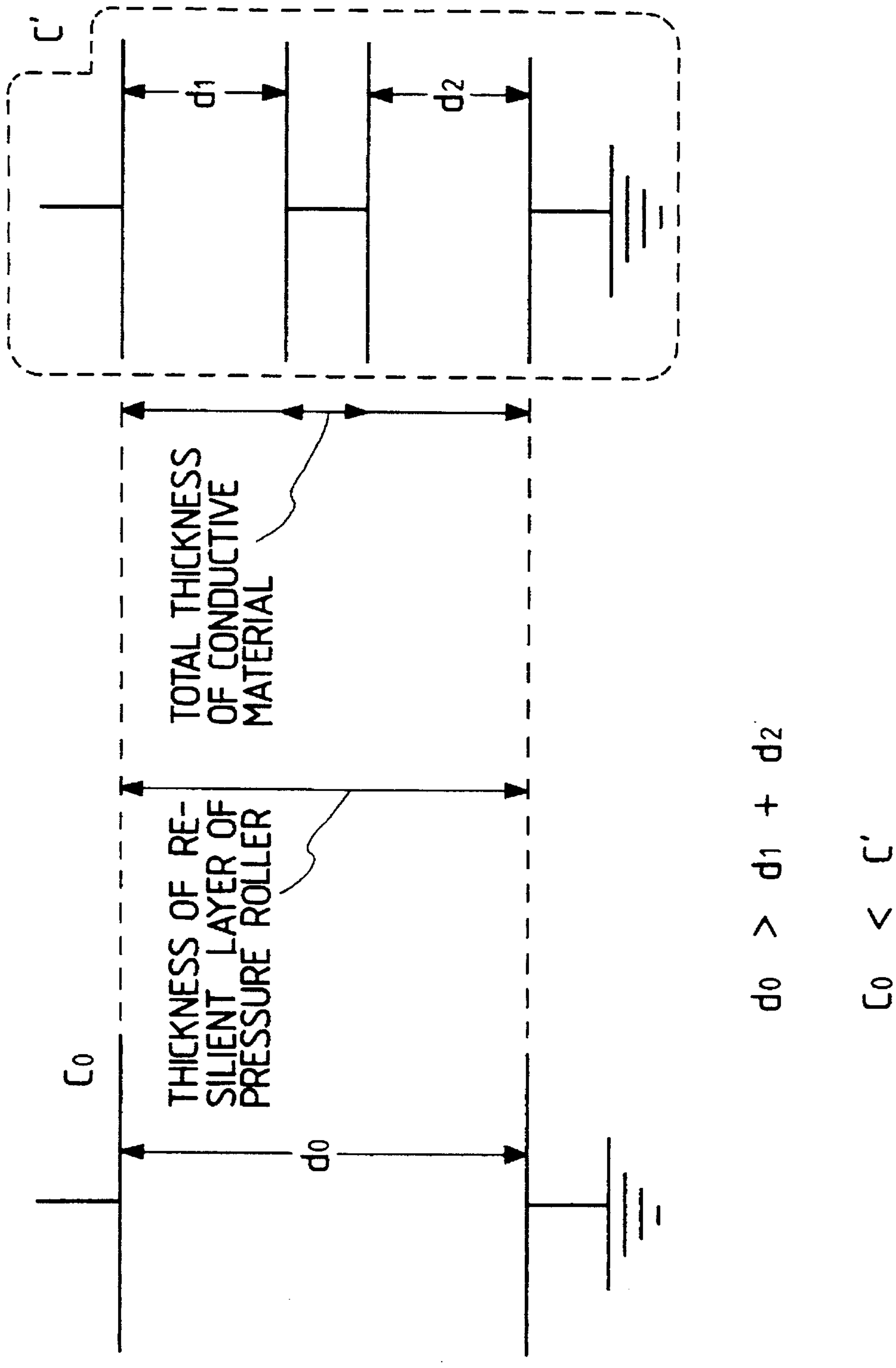
FIG. 4A is a schematic chart representing the state of a conventional pressure roller.
FIG. 4B is a schematic chart representing the state of the pressure roller shown in FIG. 2.

A roller employing insulating primer can be represented by a capacitor model shown in FIG. 4A, while the roller of the present embodiment can be represented by a capacitor model shown in FIG. 4B. In comparison with the model of the roller employing insulating primer (FIG. 4A), the model of the roller of the present embodiment (FIG. 4B) has a relatively smaller thickness of the capacitor due to the presence of dispersed low-resistance material, whereby the capacitance C increases by:

$$C = \frac{\epsilon S}{d}$$

wherein d is the thickness of capacitor; ε is dielectric constant; and S is area. When a same amount of charge is given to these capacitors, the latter model shows smaller voltage V according to:

$$V = \frac{Q}{C}$$

wherein Q is the charge and C is the capacitance. Thus the latter model shows a lower surface potential.

In the case where the surface insulating and releasing layer is composed of fluorinated resin, the thickness thereof is preferably equal to or less than 50 μm, because a larger thickness may suppress the internal elasticity. Also the resistivity of the primer layer is preferably not more than $10^3$ Ω·cm, more preferably not more than 10 Ω·cm.

Figure 5:
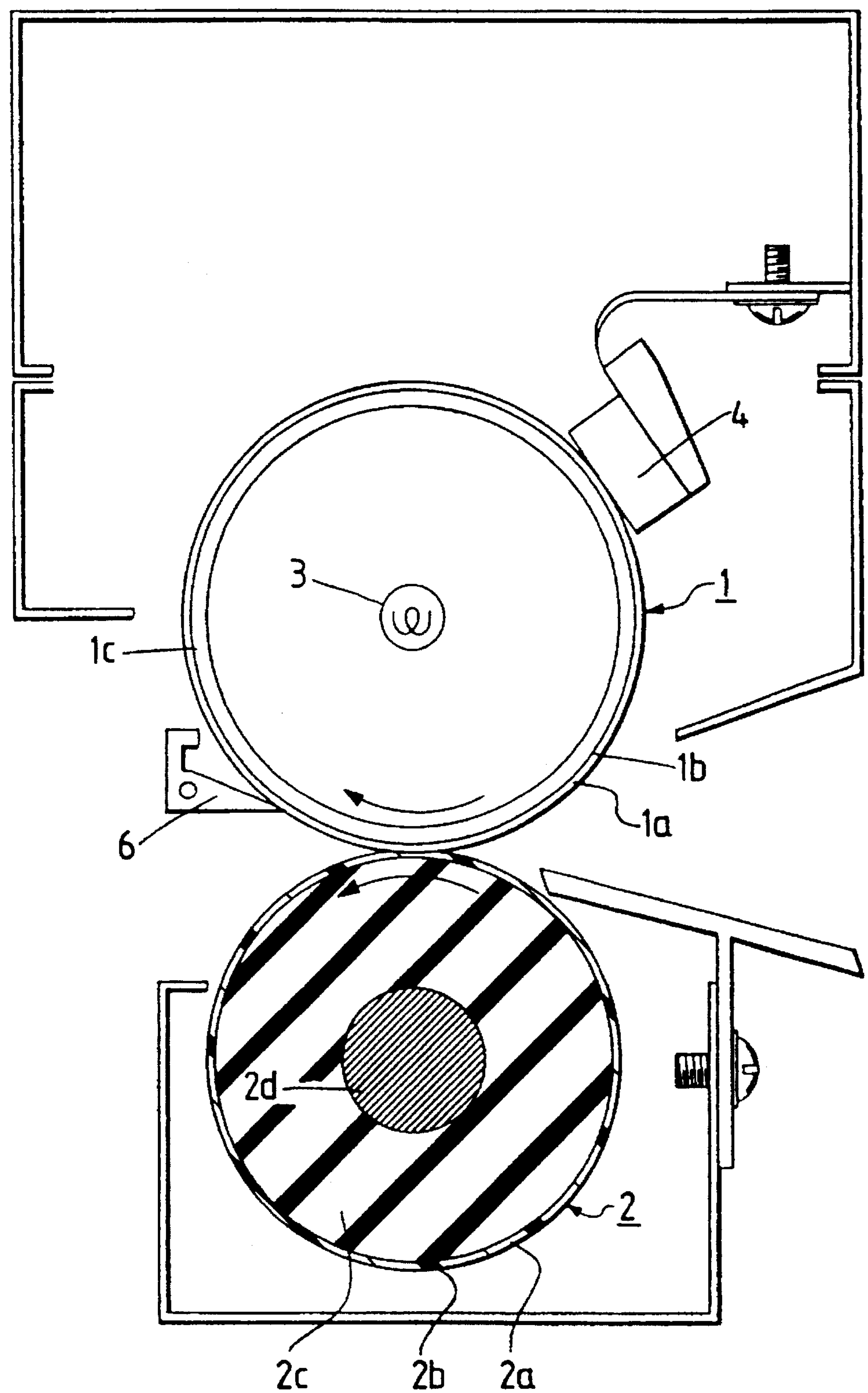
FIG. 5 is a cross-sectional view of another embodiment of the fixing device of the present invention.

In the following there will be explained another embodiment of the present invention with reference to FIG. 5, showing a fixing device constituting said embodiment in a cross-sectional view.

A thermistor 4 is provided for detecting the surface temperature of a fixing roller 1, and a temperature control circuit (not shown) controls the current supply to the halogen lamp according to the output from said thermistor, thereby maintaining the surface of the fixing roller 1 at a predetermined temperature.

In the vicinity of the nip formed by the fixing roller 1 and the pressure roller 2, there is provided a separating finger 6 maintained in contact with said fixing roller 1. The fixing roller 1 of the present embodiment is composed of a metal core **1*c* of stainless steel or aluminum of high thermal conductivity, and a releasing layer 1*a* of a thickness of 15~70 μm of filler-free pure tetrafluoroethylenealkylvinylether copolymer (PFA) resin, adhered to said core 1*c* by a primer layer 1*b***.

The fixed recording sheet is separated from the fixing roller 1, by means of the separating finger 6 maintained in pressure contact, at a predetermined position on the periphery of the fixing roller 1, by a pressurizing means (not shown) such as a spring.

The pressure roller 2 is composed of a metal core 2*d*, an insulating rubber layer 2*c* formed thereon, and a surface releasing layer 2*a* composed of filler-free pure fluorinated resin (for example perfluoroalkoxy (PFA) resin) and adhered to said rubber layer 2*c* by an electrically floating primer layer 2*b*. Said rubber layer is preferably composed of silicone rubber, but may also be composed of fluorinated rubber or a mixture of fluorinated rubber and silicone rubber.

The primer 2*b* is composed of a rubber or resinous adhesive material in which a material of low resistance (for example carbon fibers, graphite whiskers, silicon carbide fibers, silicon carbide whiskers, a metal oxide such as titanium oxide or nickel) is mixed to reduce the volume resistivity to $10^6$ Ω·cm or lower.

The pressure roller of the above-explained structure generally showed surface potential not exceeding 100V (either positive or negative) and was completely free from electrostatic toner offsetting, without sacrificing the releasing ability of the surface.

In the following there will be explained still another embodiment of the present invention.

In this embodiment, the fixing roller is same as the roller coated with pure PFA resin, employed in the preceding embodiment, and the pressure roller has an elastic layer 2*c*, as shown in FIG. 5, composed of conductive silicone rubber containing the material of low resistance explained above in an amount of 30~50%, and a surfacial releasing layer 2*a* composed of pure PFA resin.

The primer layers on both sides of the elastic layer are composed of a conventional insulating material. Also in this embodiment, the surface of the pressure roller is not significantly charged and is free from electrostatic toner offsetting.

In the following there will be explained a 4th embodiment of the present invention, in which the heat insulating material, supporting the metal core of the fixing roller as explained in the 2nd embodiment, is made electroinsulating, and the bearings 9 are composed of insulating material. The fixing roller is given a bias voltage of a polarity same as that of the toner. The pressure roller has an insulating and releasing surface layer, and the primer layer for adhering said surface layer to the elastic layer is composed of electrically floating conductive primer containing the low-resistance material.

It is already known that it is effective to provide the fixing roller with a bias voltage of a polarity the same as that of the toner for the purpose of preventing electrostatic toner offsetting, but said preventive effect is further enhanced in the present embodiment because the pressure roller is not charged. Also because the surface of the pressure roller is insulating and is free from charge transfer, there is no influence on the bias voltage supplied to the fixing roller and extremely stable performance can be maintained.

Following Table 3 shows the results of offset test and surface potential measurement on the paired rollers, on a reference example and the 2nd to 4th embodiments of the present invention. There were employed an ordinary text original document and negatively charged toner, and the results were obtained by passing 100 sheets consecutively. In Table 3, "F" indicates the fixing roller, and "P" indicates the pressure roller.

TABLE 3

| | Roller structure | Offset test | Roller surface potential |
|---|---|---|---|
| Reference example | F: semiconductive roller<br>P: silicone rubber + PFA | Offsetting occurred after 2–3 sheets | +70 V<br>+2500–+3000 V or higher |
| 2nd embodiment | F: PFA<br>P: conductive primer | No offsetting | −500–−700 V<br>+400–+450 V |
| 3rd embodiment | F: PFA<br>P: conductive silicone rubber | No offsetting | −500–−700 V<br>+300–+400 V |
| 4th embodiment | F: PFA + bias<br>P: conductive primer | No offsetting | −900–−1200 V<br>(−600 V biased)<br>−100–+90 V |

Table 3 indicates that the offset preventing effect of the embodiments of the present invention is far superior to that of the prior technology, and that the potentials of the rollers are low and stable. Also the use of pure PFA resin on the surface of the fixing roller allows it to maintain the friction resistance and releasing ability, so that stable performance can be exhibited over a prolonged period.

In the following there will be explained a 5th embodiment of the present invention, wherein the structure of the fixing unit is same as that shown in FIG. 5.

The fixing roller 1 of the present embodiment is composed of a metal core 1*c* of a material of high electric and thermal conductivity such as stainless steel or aluminum, and a releasing layer 1*a* composed of tetrafluoroethylene (PTFE) resin containing a material of low resistance, for example carbon black, carbon fibers, graphite whiskers, silicon carbide fibers, silicon carbide whiskers, a metal oxide such as titanium oxide, or nickel, in an amount of 20~40% and tetrafluoroethylenealkylvinylether copolymer resin (PFA) in an amount of 5~15%, adhered onto said metal core by a primer layer 1*b* composed of an insulating rubber or resinous adhesive material. Said releasing layer 1*a* has a volume resistivity of $10^{11}$–$10^{14}$ Ω·cm due to the presence of material of low resistance mixed therein.

The pressure roller 2 is composed of a metal core 2*d*, an insulating rubber layer 2*c* formed thereon, and a surface releasing layer 2*a* of filler-free pure insulating fluorinated resin (for example perfluoroalkoxy (PFA) resin) adhered to said insulating rubber layer 2*c* by a primer layer 2*b*. This is same as the pressure roller employed in the 2nd embodiment.

Also this embodiment provides an excellent charging preventive effect because, as in the 1st embodiment, the surface layer of the fixing roller functions as the electrode in the capacitor model shown in FIG. 4, due to the presence of material of low resistance.

In the following there will be explained a 6th embodiment of the present invention, wherein the fixing roller is same as that in the 5th embodiment.

In the pressure roller, the elastic layer 2*c* on the metal core is composed of conductive silicone rubber of which volume resistivity is reduced to $10^6$ Ω·cm by mixing of material of low resistance in an amount of 30~50%, and the surface releasing layer is composed of a pure PFA resin tube. The primer layers on both sides of the elastic layer are made insulating.

Also in this embodiment, the pressure roller is not significantly charged, and is free from toner offsetting.

In the following there will be explained a 7th embodiment of the present invention, wherein the fixing roller is the same as that in the 5th embodiment.

In this embodiment, as in the 4th embodiment, the fixing roller is supported by thermo- and electro-insulating bushings, and is given a bias voltage of a polarity same as that of the toner. In the pressure roller, a material of low resistance is added to the electrically floating primer layer between the surface insulating and releasing layer and the insulating elastic layer, thereby reducing the volume resistivity of said primer layer to 10 Ω·cm or lower.

Following Table 4 shows the results of offset test and surface potential measurements of the paired rollers, on a reference example and the 5th to 7th embodiments of the present invention.

TABLE 4

| | Roller structure | Offset test result | Roller structure potential |
|---|---|---|---|
| Reference example | F: semiconductive roller | Offsetting occurred | 0 V |
| | P: silicone rubber + PFA | after 2–3 sheets | +2500–+3000 V or higher |
| 5th embodiment | F: semiconductive roller | No offsetting | about −100 V |
| | P: conductive primer | | +90—110 V |
| 6th embodiment | F: semiconductive roller | No offsetting | about 0 V |
| | P: conductive silicone rubber | | +90—120 V |
| 7th embodiment | F: semiconductive roller + bias (+600 V) | No offsetting | +600–+700 V (+600 V biased) |
| | P: conductive primer | | +90—90 V |

Results in Table 4 indicate that the effect of the embodiments of the present invention for preventing electrostatic toner offsetting is far superior to that of the reference example, and that the surface potentials of the rollers are low and stable. Particularly because of a semiconductive releasing layer of fluorinated resin containing material of low resistance in the surface layer, the fixing roller shows a very low potential, thereby being capable of preventing the electrostatic toner offsetting, and is particularly effective when positively charged toner is employed.

In the foregoing, the present invention has been explained by preferred embodiments thereof, but the present invention is not limited by such embodiments and is subject to various modifications within the scope and spirit of the appended claims.

We claim:

1. An elastic roller, comprising:

a core member;

an electrically insulating rubber layer provided on said core member;

a low resistance layer provided on said rubber layer and which is electrically floating, said low resistance layer having a volume resistivity equal to or lower than 10 Ω·cm; and an electrically insulating surface releasing layer provided on said low resistance layer.

2. An elastic roller according to claim 1, wherein said low resistance layer is a primer layer which adheres said rubber layer and said surface releasing layer.

3. An elastic roller according to claim 1, wherein said surface releasing layer has a volume resistivity equal to or greater than $10^{14}$ Ω·cm.

4. An elastic roller according to claim 1, wherein said surface releasing layer has a thickness equal to or lower than 50 μm.

5. An elastic roller according to claim 1, wherein said rubber layer is composed of silicone rubber and said releasing surface layer is composed of a fluorinated resin.

6. An elastic roller according to claim 5, wherein said fluorinated resin is PFA.

7. An elastic roller according to claim 1, wherein said rubber layer is provided on a roller core member.

8. An elastic layer according to claim 1, wherein said rubber layer is thicker than said surface layer and said low resistance layer.

9. A fixing device, comprising:

a fixing roller for contacting an unfixed image; and a pressure roller abutting against said fixing roller, and forming a nip therewith, wherein said pressure roller comprises:

a core member;

an electrically insulating rubber layer provided on said core member;

a low resistance layer provided on said rubber layer and which is electrically floating, said low resistance layer having a volume resistivity equal to or lower than 10 Ω·cm; and an electrically insulating surface releasing layer provided on said low resistance layer.

10. A fixing device according to claim 9, wherein said low resistance layer is a primer layer which adheres said rubber layer and said surface releasing layer.

11. A fixing device according to claim 9, wherein said surface releasing layer has a volume resistivity equal to or greater than $10^{14}$ Ω·cm.

12. A fixing device according to claim 11, wherein said surface resistivity layer has a thickness equal to or lower than 50 μm.

13. A fixing device according to claim 9, wherein said rubber layer is composed of silicone rubber said surface releasing layer is composed of a fluorinated resin.

14. A fixing device according to claim 13, wherein said fluorinated resin is PFA.

15. A fixing device according to claim 9, wherein said rubber layer is provided on a core member.

16. A fixing device according to claim 9, wherein said low resistance layer is a primer layer which adheres said rubber layer and said surface releasing layer.

17. A fixing device according to claim 9, further comprising a heat member for heating said fixing roller.

18. A fixing device according to claim 9, wherein said fixing roller has a hardness greater than that of said pressure roller.

19. A fixing device according to claim 9, wherein said unfixed image is positively charged.

* * * * *

UNITED STATES PATENT AND TRADEMARK OFFICE

CERTIFICATE OF CORRECTION

PATENT NO. : 5,561,511

DATED : October 1, 1996

INVENTOR(S) : NOBORU MIZUNUMA, ET AL.

It is certified that error appears in the above-indentified patent and that said Letters Patent is hereby corrected as shown below: On the title page:

Item: [56] RC,
line USPD, insert "4470688 9/84 Inagaki et al.--.

Column 1,
line 18, "so called" should read --a so-called--; and
line 44, "the: roller" should read --the roller--.

Column 2,
line 3, "in fixing, and" should read --fixing, and in--.

Column 3,
line 4, "(now" should read --(not--;
line 20, "be same" should read --be the same--; and
line 34, "unfixed" should read --an unfixed--.

Column 5,
line 26, "is same" should read --is the same--.

Column 6,
Table 3, "-500∼-700 V" should read -- -500 ∼ -700 V--;
Table 3, "+400∼+450 V" should read -- +400 ∼ +450 V--;
Table 3, "-500∼-700 V" should read -- -500 ∼ -700 V--;
Table 3, "+300∼+400 V" should read -- +300 ∼ +400 V--;
Table 3, "-900∼-1200 V" should read -- -900 ∼ -1200 V--; and
Table 3, "-100∼+90" should read -- -100 ∼ +90 V--.

UNITED STATES PATENT AND TRADEMARK OFFICE

CERTIFICATE OF CORRECTION

PATENT NO. : 5,561,511
DATED : October 1, 1996
INVENTOR(S) : NOBORU MIZUNUMA, ET AL.

It is certified that error appears in the above-indentified patent and that said Letters Patent is hereby corrected as shown below:

Column 7,
line 3, "same" should read --the same--;
Table 4, "+2500～+3000 V" should read -- +2500～+3000 V--;
Table 4, "+90 ～-110 V" should read -- +90～-110 V--;
Table 4, "+90 ～-120 V" should read -- +90～-120 V--;
Table 4, "+600～+700 V" should read -- +600～+700 V--; and
Table 4, "+90 ～-90 V" should read -- +90 ～-90 V--.

Signed and Sealed this

Twenty-fifth Day of March, 1997

Attest:

BRUCE LEHMAN

*Attesting Officer*

*Commissioner of Patents and Trademarks*